United States Patent
Sasaki

(10) Patent No.: US 12,424,980 B2
(45) Date of Patent: Sep. 23, 2025

(54) DOHERTY AMPLIFIER

(71) Applicant: Mitsubishi Electric Corporation, Tokyo (JP)

(72) Inventor: Yoshinobu Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 461 days.

(21) Appl. No.: 18/004,440

(22) PCT Filed: Dec. 3, 2020

(86) PCT No.: PCT/JP2020/045111
§ 371 (c)(1),
(2) Date: Jan. 5, 2023

(87) PCT Pub. No.: WO2022/118445
PCT Pub. Date: Jun. 9, 2022

(65) Prior Publication Data
US 2023/0299721 A1 Sep. 21, 2023

(51) Int. Cl.
*H03F 1/02* (2006.01)
*H01L 23/66* (2006.01)
*H03F 1/56* (2006.01)

(52) U.S. Cl.
CPC ........... *H03F 1/0288* (2013.01); *H01L 23/66* (2013.01); *H03F 1/56* (2013.01); *H01L 2223/6611* (2013.01)

(58) Field of Classification Search
CPC ......... H03F 1/0288; H03F 1/56; H01L 23/66; H01L 2223/6611
USPC ........................................................ 330/295
See application file for complete search history.

(56) References Cited

U.S. PATENT DOCUMENTS 2,463,547 A * 3/1949 Meier ..................... H01Q 9/42
343/831
4,814,780 A * 3/1989 Sterns ...................... H01P 5/04
343/756

(Continued)

FOREIGN PATENT DOCUMENTS

| JP | 2010-050611 A | 3/2010 | |
| JP | 6026062 B1 | 11/2016 | |
| KR | 101910896 B1 * | 10/2018 | ........... H03F 1/0288 |

OTHER PUBLICATIONS

Xing Sun et al. ("Design of 74% Fractional Bandwidth Continuous-Mode Doherty Power Amplifier Using Compensation Susceptance", IEEE Transactions on Circuits and Systems—II: Express Briefs, vol. 68, No. 6, Jun. 2021) (Year 2021).*

(Continued)

*Primary Examiner* — Hafizur Rahman
(74) *Attorney, Agent, or Firm* — Studebaker Brackett PLLC

(57) ABSTRACT

A pass phase of a path including the first input phase delay circuit, the carrier amplifier and the second output phase delay circuit is the same as that of a path including the second input phase delay circuit, the peak amplifier and the second output phase delay circuit in an operating band. A parasitic capacitance on a drain side of the first transistor and the first output phase delay circuit constitute a 90-degree line viewed from the first transistor. A parasitic capacitance on a drain side of the second transistor and the second output phase delay circuit constitute a 0-degree line viewed from the second transistor. A value obtained by dividing, by frequency, susceptance of a circuit constituted with the second transistor and the second output phase delay circuit when viewed from the composite point when the peak amplifier is off has a positive slope with respect to the frequency.

7 Claims, 19 Drawing Sheets

(56) References Cited

U.S. PATENT DOCUMENTS

| | | | | |
|---|---|---|---|---|
| 9,531,328 B2* | 12/2016 | Frei | ......................... | H03F 3/195 |
| 2004/0041627 A1* | 3/2004 | Kim | ..................... | H03F 1/0266 |
| | | | | 330/124 R |
| 2005/0231278 A1* | 10/2005 | Blednov | .............. | H03F 1/0288 |
| | | | | 330/124 R |
| 2016/0173039 A1* | 6/2016 | Frei | ...................... | H03F 1/0288 |
| | | | | 29/831 |
| 2019/0028062 A1 | 1/2019 | Shinjo et al. | | |
| 2020/0321918 A1* | 10/2020 | Grebennikov | ........ | H03F 1/0288 |

OTHER PUBLICATIONS

Giofre et al. "Designing a Tri-Band Concurrent Doherty Power Amplifier", 2015 Integrated Nonlinear Microwave and Millimetre-wave Circuits Workshop (INMMiC). (Year: 2015).*

Kang et al. "Optimized Broadband Load Network for Doherty Power Amplifier Based on Bandwidth Balancing", IEEE Microwave and Wireless Components Letters, vol. 31, No. 3, Mar. 2021 (Year: 2021).*

Chen et al., "Simplified All-in-One Load Network of the Broadband Doherty Power Amplifier", IEEE Transactions on Microwave Theory and Techniques, vol. 73, No. 2, Feb. 2025. (Year: 2025).*

Yuji Komatsuzaki et al.; "3.0-3.6 GHz Wideband, over 46% Average Efficiency GaN Doherty Power Amplifier with Frequency Dependency Compensating Circuits"; 2017 IEEE Topical Conference on Power Amplifiers for Wireless and Radio Applications; pp. 22-24.

International Search Report issued in PCT/JP2020/045111; mailed Feb. 22, 2021.

* cited by examiner

DOHERTY AMPLIFIER

FIELD

The present disclosure relates to a small Doherty amplifier capable of wide-band operation.

BACKGROUND

In ground microwave communications and mobile communications in recent years, multiplexing of signals and common amplification for a plurality of channels have been often used. In this case, a difference between saturation output power of an amplifier that amplifies a signal and peak power of the signal increases, which increases signal distortion and degrades operation efficiency of the amplifier. Thus, to cause the amplifier to operate at high efficiency even in a case where a difference between peak power and average power is large, there is a case where a load modulation amplifier typified by a Doherty amplifier is used.

In the Doherty amplifier, a high-frequency input signal that is input is divided into two signals, one signal is input to a carrier amplifier, and the other is input to a peak amplifier. The carrier amplifier operates, for example, with a class A or class AB bias and always amplifies an input signal. On the other hand, the peak amplifier operates with a class C bias and amplifies an input signal having power equal to or greater than predetermined power. If the input signal is small, the peak amplifier does not operate, and thus, impedance of the peak amplifier when viewed from a composite point becomes substantially open. In this event, output impedance of the carrier amplifier is modulated by a phase delay circuit and becomes several fold, so that saturation output becomes lower, but efficient operation is accomplished.

Upon high output, the peak amplifier also operates, and thus, impedance at the composite point can be regarded as being divided into impedance on the carrier amplifier side and impedance on the peak amplifier side. Thus, the impedance at the composite point on the carrier amplifier side becomes high. In accordance with this, output impedance of a transistor becomes lower, and output power becomes great.

In recent years, a system typified by 5G in which a number of amplifiers are arranged over an antenna has emerged through further evolution of mobile communications, and thus, a Doherty amplifier has been desired to be smaller and support a wider band. For example, a Doherty amplifier that achieves downsizing by reducing the number of components by actively using a parasitic capacitance on a drain side of a transistor has been proposed (see, for example, PTL 1). Further, a Doherty amplifier has also been proposed in which a line of n×180 degrees when viewed from a drain electrode is positioned at an output circuit of the peak amplifier and a line of (n−1)×180+90 degrees is positioned at an output circuit of the carrier amplifier to implement wide-band operation.

CITATION LIST

Patent Literature

[PTL 1] JP 2010-050611 A

SUMMARY

Technical Problem

A Doherty amplifier in related art using a parasitic capacitance of a transistor includes few circuit elements, and thus, has difficulty in implementing wide-band operation. Further, a Doherty amplifier in which lines are positioned on a peak amplifier side and on a carrier amplifier side requires an extremely large circuit size. It is therefore difficult to obtain a small wide-band Doherty amplifier in related art.

The present disclosure has been made to solve the problems as described above, and an object of the present disclosure is to obtain a small Doherty amplifier capable of wide-band operation.

Solution to Problem

A Doherty amplifier according to the present disclosure includes: a divider dividing an input signal into first and second input signals; a first input phase delay circuit delaying the first input signal; a second input phase delay circuit delaying the second input signal; a carrier amplifier including a first transistor amplifying an output signal of the first input phase delay circuit; a peak amplifier including a second transistor amplifying an output signal of the second input phase delay circuit; a first output phase delay circuit delaying an output signal of the carrier amplifier; a second output phase delay circuit delaying an output signal of the peak amplifier; and an impedance conversion circuit converting output impedance of a composite point of output of the first output phase delay circuit and output of the second output phase delay circuit, wherein a pass phase of a path including the first input phase delay circuit, the carrier amplifier and the second output phase delay circuit is the same as a pass phase of a path including the second input phase delay circuit, the peak amplifier and the second output phase delay circuit in an operating band, a parasitic capacitance on a drain side of the first transistor and the first output phase delay circuit constitute a 90-degree line at a center frequency in the operating band when viewed from the first transistor, a parasitic capacitance on a drain side of the second transistor and the second output phase delay circuit constitute a 0-degree line at the center frequency when viewed from the second transistor, and a value obtained by dividing, by frequency, susceptance of a circuit constituted with the second transistor and the second output phase delay circuit when viewed from the composite point when the peak amplifier is off has a positive slope with respect to the frequency.

Advantageous Effects of Invention

In the present disclosure, the parasitic capacitance on the drain side of the first transistor of the carrier amplifier and the first output phase delay circuit constitute a 90-degree line, and the parasitic capacitance on the drain side of the second transistor of the peak amplifier and the second output phase delay circuit constitute a 0-degree line. In this manner, the number of components is reduced by actively using the parasitic capacitance of the transistors. Further, a line with a long electrical length is not included, so that a circuit becomes smaller. Further, a value obtained by dividing, by frequency, susceptance of the circuit constituted with the second transistor and the second output phase delay circuit when viewed from the composite point when the peak amplifier is off has a positive slope with respect to the frequency. By this means, it is possible to keep a phase difference between the carrier amplifier side and the peak amplifier side smaller over a wide band. It is therefore possible to achieve wide-band characteristics both upon saturation operation and upon back-off operation.

DESCRIPTION OF EMBODIMENTS

A Doherty amplifier according to the embodiments of the present disclosure will be described with reference to the drawings. The same components will be denoted by the same symbols, and the repeated description thereof may be omitted.

Embodiment 1

Figure 1:
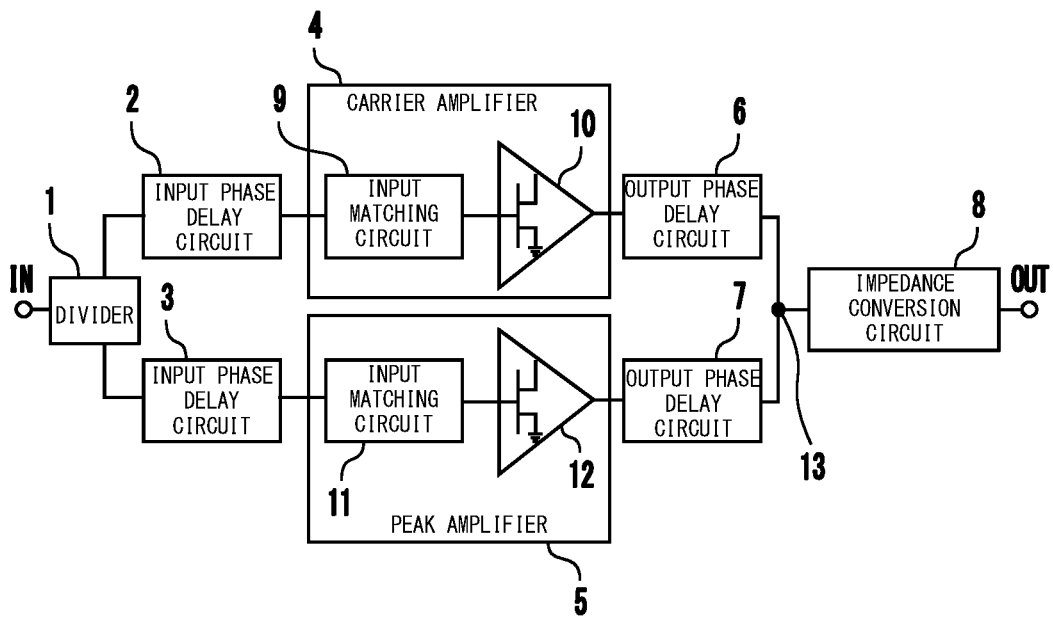
FIG. 1 is a circuit diagram illustrating a Doherty amplifier according to Embodiment 1.

FIG. 1 is a circuit diagram illustrating a Doherty amplifier according to Embodiment 1. A divider 1, a first input phase delay circuit 2, a second input phase delay circuit 3, a carrier amplifier 4, a peak amplifier 5, a first output phase delay circuit 6, a second output phase delay circuit 7 and an impedance conversion circuit 8 are formed on a high-frequency substrate.

The divider 1 divides an input signal from an input terminal IN to the carrier amplifier 4 and the peak amplifier 5 so that power becomes a desired value. The division ratio becomes greater as a difference between average power and peak power of the input signal is larger. Here, a ratio between power of a first input signal divided to the carrier amplifier 4 and power of a second input signal divided to the peak amplifier 5 is set at 1: n (=1.4). The carrier amplifier 4 operates, for example, with a class A or class AB bias and always amplifies an input signal. The peak amplifier 5 operates with a class C bias and amplifies an input signal having power equal to or greater than predetermined power.

The first input phase delay circuit 2 delays the first input signal and inputs the delayed first input signal to the carrier amplifier 4. The second input phase delay circuit 3 delays the second input signal and inputs the delayed second input signal to the peak amplifier 5. The carrier amplifier 4 includes an input matching circuit 9 and a first transistor 10. The peak amplifier 5 includes an input matching circuit 11 and a second transistor 12. The first transistor 10 and the second transistor 12 are, for example, field effect transistors (FETs).

The first transistor 10 amplifies an output signal of the first input phase delay circuit 2 input via the input matching circuit 9. The second transistor 12 amplifies an output signal of the second input phase delay circuit 3 input via the input matching circuit 11.

The first output phase delay circuit 6 delays an output signal of the carrier amplifier 4. The second output phase delay circuit 7 delays an output signal of the peak amplifier 5. An output terminal of the first output phase delay circuit 6 and an output terminal of the second output phase delay circuit 7 are directly connected at a composite point 13. The impedance conversion circuit 8 is connected between the composite point 13 and an output terminal OUT. The impedance conversion circuit 8 converts output impedance of the composite point 13 of output of the first output phase delay circuit 6 and output of the second output phase delay circuit 7.

In a case where both the carrier amplifier 4 and the peak amplifier 5 operate, it is necessary to minimize a difference between a pass phase of a path including the carrier amplifier 4 and a pass phase of a path including the peak amplifier 5 within an operating frequency band. Thus, in the first input phase delay circuit 2 and the second input phase delay circuit 3, correction circuits (not illustrated) are provided so as to reduce a difference between a pass phase of a path from the input terminal IN to the composite point 13 by way of the carrier amplifier 4 side and a pass phase of a path from the input terminal IN to the composite point 13 by way of the peak amplifier 5 side over a wide band upon saturation operation. Thus, a pass phase of a path including the first input phase delay circuit 2, the carrier amplifier 4 and the first output phase delay circuit 6 becomes the same as a pass phase of a path including the second input phase delay circuit 3, the peak amplifier 5 and the second output phase delay circuit 7 in an operating band.

A parasitic capacitance Cdsc on a drain side of the first transistor 10 and the first output phase delay circuit 6 constitute a 90-degree line at a center frequency in the operating band when viewed from the first transistor 10. Thus, a phase difference between an output signal of the first transistor 10 without the parasitic capacitance Cdsc and an output signal of the first output phase delay circuit 6 becomes 90 degrees at a center frequency fc in the operating band. Note that the phase difference is slightly shifted from 90 degrees in actual design. Particularly, for optimizing a circuit for a second harmonic, there is a case where its characteristics are improved by slightly shifting the phase difference from 90 degrees.

A parasitic capacitance Cdsp on a drain side of the second transistor 12 and the second output phase delay circuit 7 constitute a 0-degree line at the center frequency when viewed from the second transistor 12. Thus, a phase difference between an output signal of the second transistor 12 without the parasitic capacitance Cdsp and an output signal of the second output phase delay circuit 7 becomes 0 degree at the center frequency fc.

Figure 2:
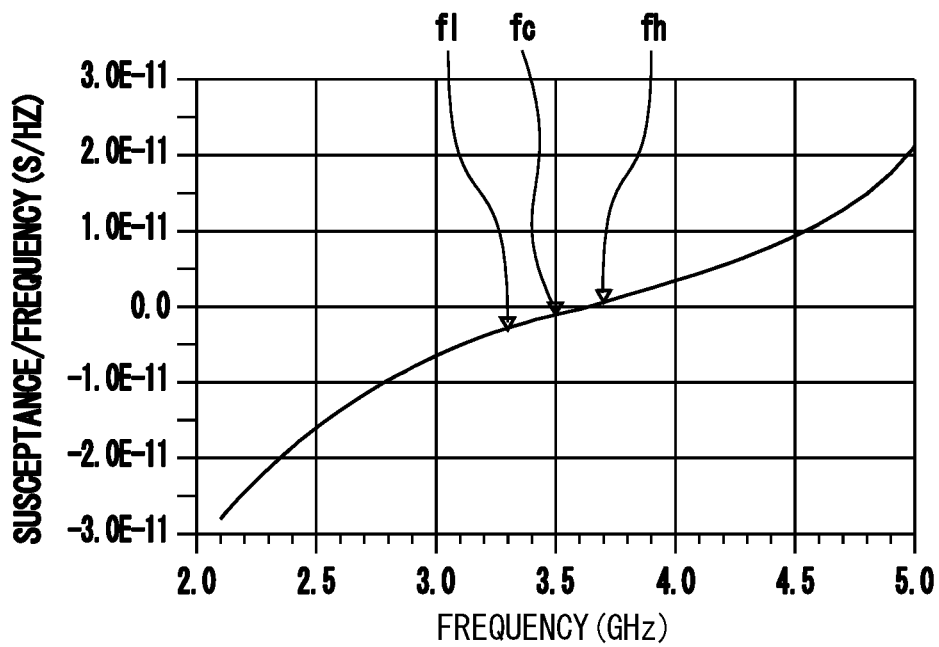
FIG. 2 is a view indicating frequency dependency of a value obtained by dividing, by frequency, susceptance of a circuit constituted with the second transistor and the second output phase delay circuit according to Embodiment 1.

The second output phase delay circuit 7 is constituted so that a value obtained by dividing, by frequency, susceptance of a circuit constituted with the second transistor 12 and the second output phase delay circuit 7 when viewed from the composite point 13 when the peak amplifier 5 is off has a positive slope with respect to the frequency. FIG. 2 is a view indicating frequency dependency of a value obtained by dividing, by frequency, susceptance of a circuit constituted with the second transistor and the second output phase delay circuit according to Embodiment 1. It can be seen that the value obtained by dividing the susceptance by the frequency increases in accordance with the frequency.

Figure 3:
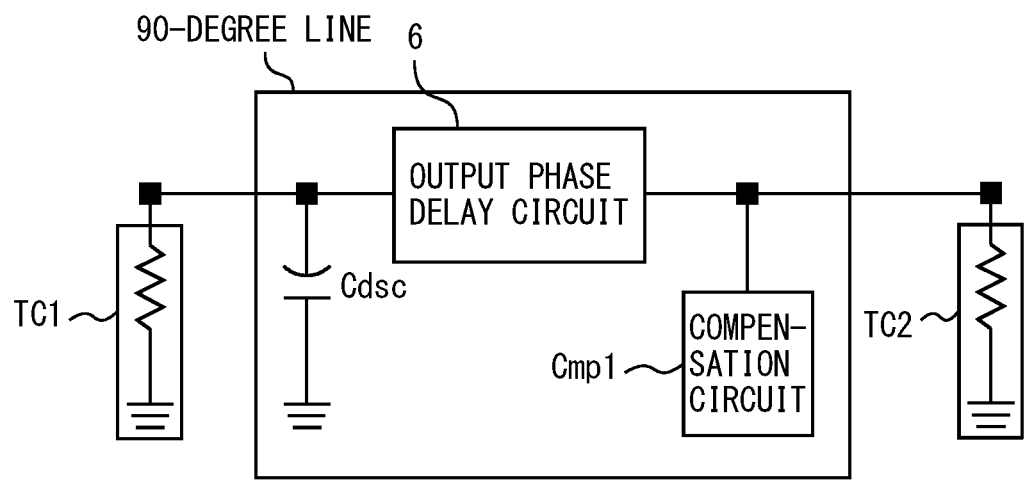
FIG. 3 is a circuit diagram illustrating an output circuit of the carrier amplifier upon saturation operation of the Doherty amplifier according to Embodiment 1.

FIG. 3 is a circuit diagram illustrating an output circuit of the carrier amplifier upon saturation operation of the Doherty amplifier according to Embodiment 1. In the Doherty amplifier, frequency characteristics of the output circuit of the carrier amplifier 4 affect frequency characteristics of the entire amplifier. If a band of the output circuit of the carrier amplifier 4 is narrow, the Doherty amplifier has characteristics of a narrow band as a whole, while if the band of the output circuit of the carrier amplifier 4 is wide, the Doherty amplifier has characteristics of a wide band as a whole. Description will be provided below using an example of a Doherty amplifier of a frequency band from 3.3 GHz to 3.7 GHz.

TC1 indicates a terminal of an intrinsic drain end without parasitic components of the first transistor 10 of the carrier amplifier 4. TC2 indicates a terminal of the composite point 13. Impedance of the terminal TC1 is adjusted to match Roc, and impedance of the terminal TC2 is adjusted to match Rjc. Cdsc is a parasitic capacitance of a drain end of the first transistor 10 of the carrier amplifier 4. A compensation circuit Cmp1 is a circuit such that a pass phase is 0 degree at the center frequency fc and a value obtained by dividing susceptance by frequency has a positive slope with respect to the frequency. A circuit including the parasitic capacitance Cdsc, the first output phase delay circuit 6 and the compensation circuit Cmp1 is adjusted so that characteristic impedance becomes 1(Roc-Rjc) and an electrical length becomes equivalent to 90 degrees at the center frequency fc.

On the other hand, upon back-off operation of the Doherty amplifier, the peak amplifier 5 is in an off state, and thus, impedance of TC2 becomes Rjc/(1+n) (where n is a division ratio), and impedance of TC1 becomes Roc·(1+n).

Figure 4:
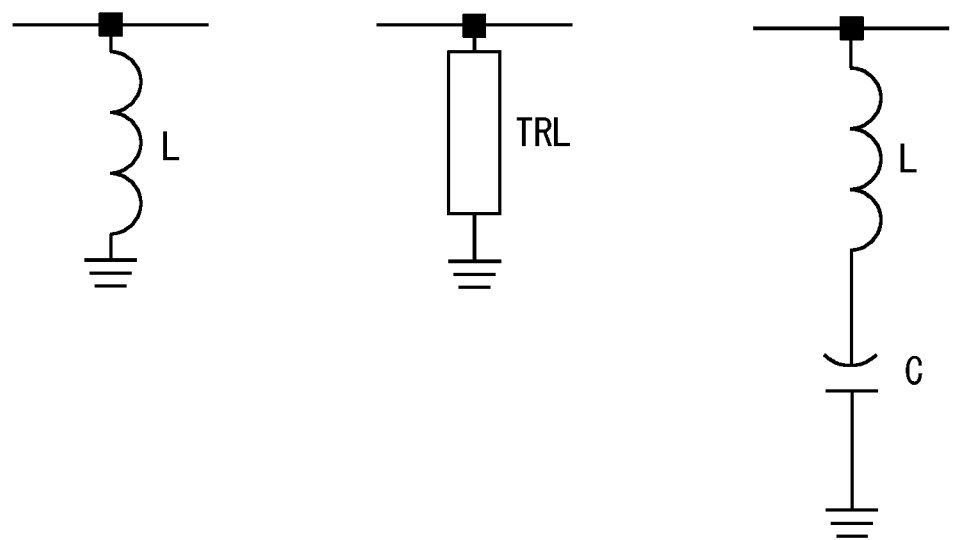
FIG. 4 is a view illustrating specific examples of the compensation circuit.

FIG. 4 is a view illustrating specific examples of the compensation circuit. The specific example on a left side is a parallel inductor, and a value obtained by dividing susceptance of this circuit by the frequency f is $-1/2\pi^2 L$. The specific example at the center is a short stub, and a value obtained by dividing susceptance of this circuit by the frequency f is $-1/Z_1 f\tan(kf)$. The specific example on a right side is a shunt LC circuit, and a value obtained by dividing susceptance of this circuit by the frequency f is $2\pi C/(1-4\pi^2 f^2 CL)$. In either case, the value obtained by dividing the susceptance by the frequency increases with the frequency.

Figure 5:
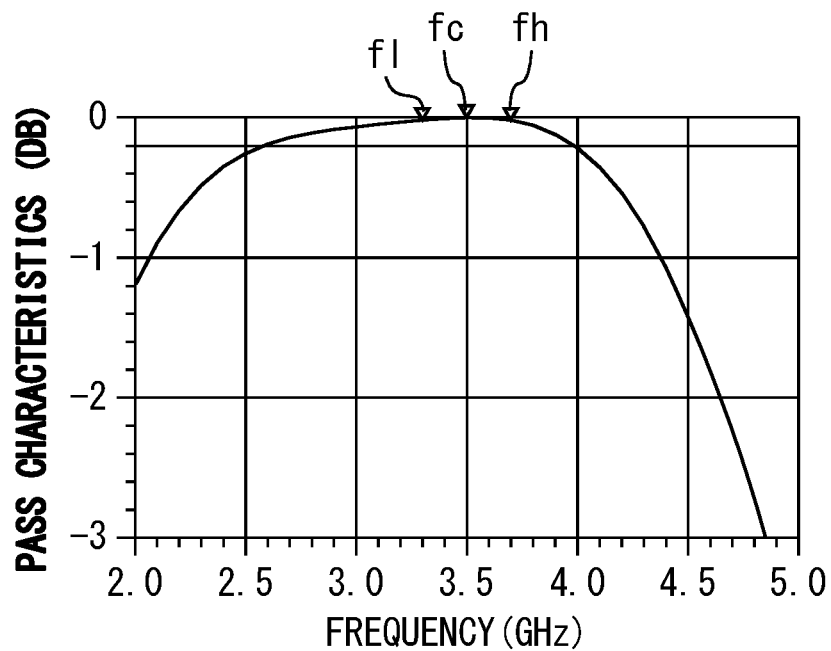
FIG. 5 is a view indicating characteristics upon saturation in a case where the output circuit of the carrier amplifier does not include a compensation circuit.
Figure 6:
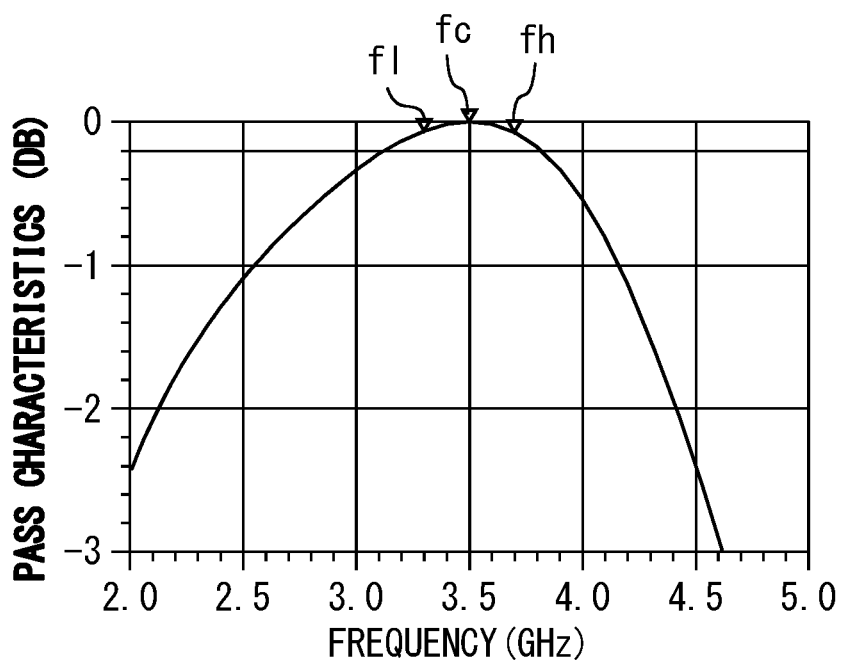
FIG. 6 is a view indicating characteristics upon back-off in a case where the output circuit of the carrier amplifier does not include a compensation circuit.

FIG. 5 is a view indicating characteristics upon saturation in a case where the output circuit of the carrier amplifier does not include a compensation circuit. FIG. 6 is a view indicating characteristics upon back-off in a case where the output circuit of the carrier amplifier does not include a compensation circuit. It can be seen that while wide-band performance can be obtained upon saturation, the band becomes narrow upon back-off.

Figure 7:
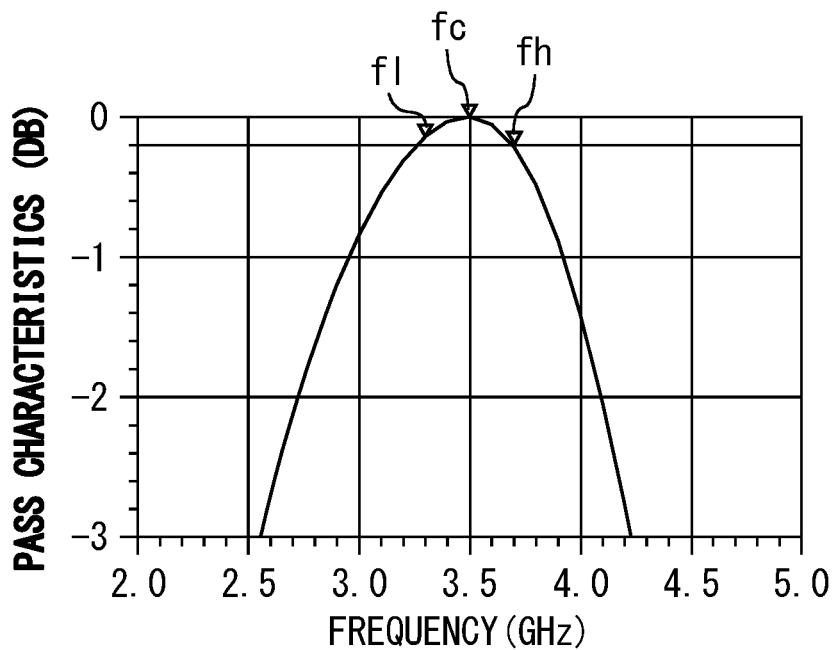
FIG. 7 is a view indicating characteristics upon saturation in a case where the output circuit of the carrier amplifier includes a compensation circuit.
Figure 8:
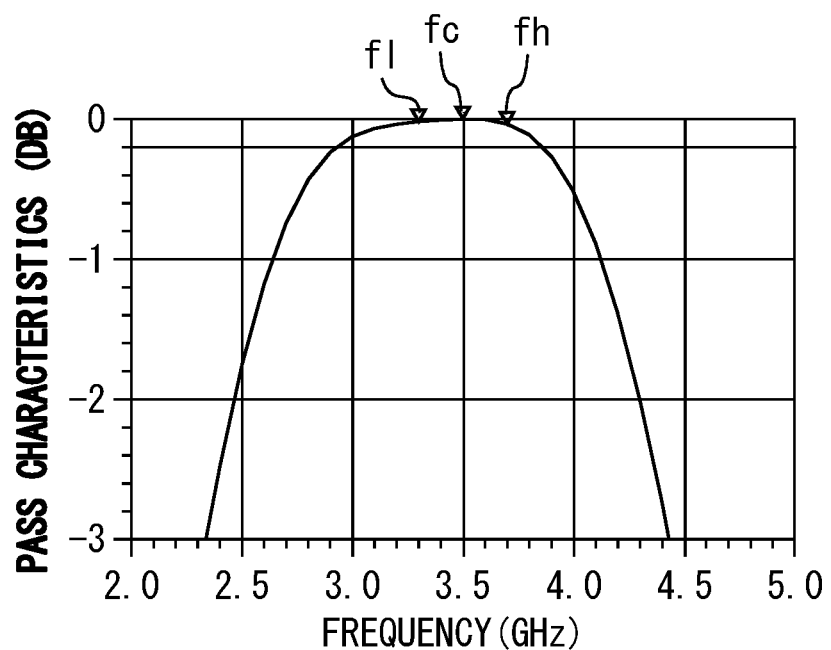
FIG. 8 is a view indicating characteristics upon back-off in a case where the output circuit of the carrier amplifier include a compensation circuit.

FIG. 7 is a view indicating characteristics upon saturation in a case where the output circuit of the carrier amplifier includes a compensation circuit. FIG. 8 is a view indicating characteristics upon back-off in a case where the output circuit of the carrier amplifier include a compensation circuit. It can be seen that while wide-band performance can be obtained upon back-off, the band becomes narrow upon saturation operation.

It can be seen from the above that if the output circuit of the carrier amplifier includes the compensation circuit Cmp1 upon back-off and does not include the compensation circuit Cmp1 upon saturation, a Doherty amplifier capable of wide-band operation can be implemented.

Figure 9:
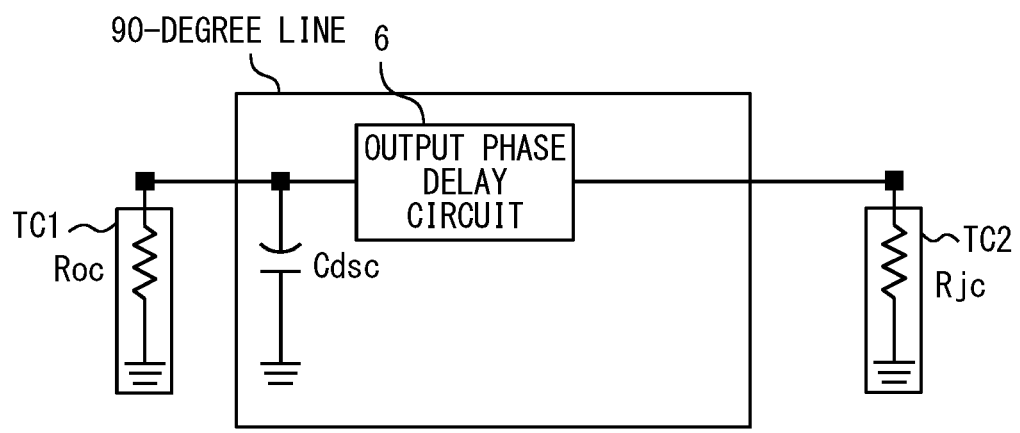
FIG. 9 is a view for explaining behavior of the carrier amplifier and the peak amplifier upon saturation.
Figure 9:
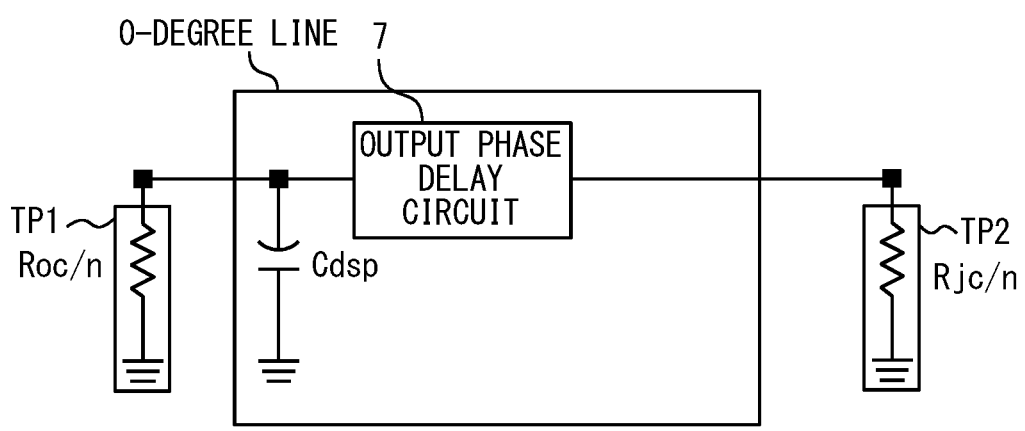

Subsequently, operation of the Doherty amplifier according to Embodiment 1 will be described. FIG. 9 is a view for explaining behavior of the carrier amplifier and the peak amplifier upon saturation. TP1 indicates a terminal of an intrinsic drain end without parasitic components of the second transistor 12 of the peak amplifier 5. TP2 indicates a terminal of the composite point 13. Impedance of the terminal TP1 is adjusted to match Roc/n, and impedance of the terminal TP2 is adjusted to match Rjc/n. Cdsp is a parasitic capacitance of the drain end of the second transistor 12 of the peak amplifier 5.

In the present embodiment, configurations of the first input phase delay circuit 2 and the second input phase delay circuit 3 are adjusted so that the pass phase of the path including the first input phase delay circuit 2, the carrier amplifier 4 and the first output phase delay circuit 6 becomes the same as the pass phase of the path including the second input phase delay circuit 3, the peak amplifier 5 and the second output phase delay circuit 7 in the operating band. As a result of this, as illustrated in FIG. 9, operation upon saturation can be considered as parallel operation of the circuit on the carrier amplifier 4 side and the circuit on the peak amplifier 5 side. Thus, the path of the carrier amplifier 4 does not include the compensation circuit Cmp1, and thus, wide-band characteristics as illustrated in FIG. 5 can be achieved.

Figure 10:
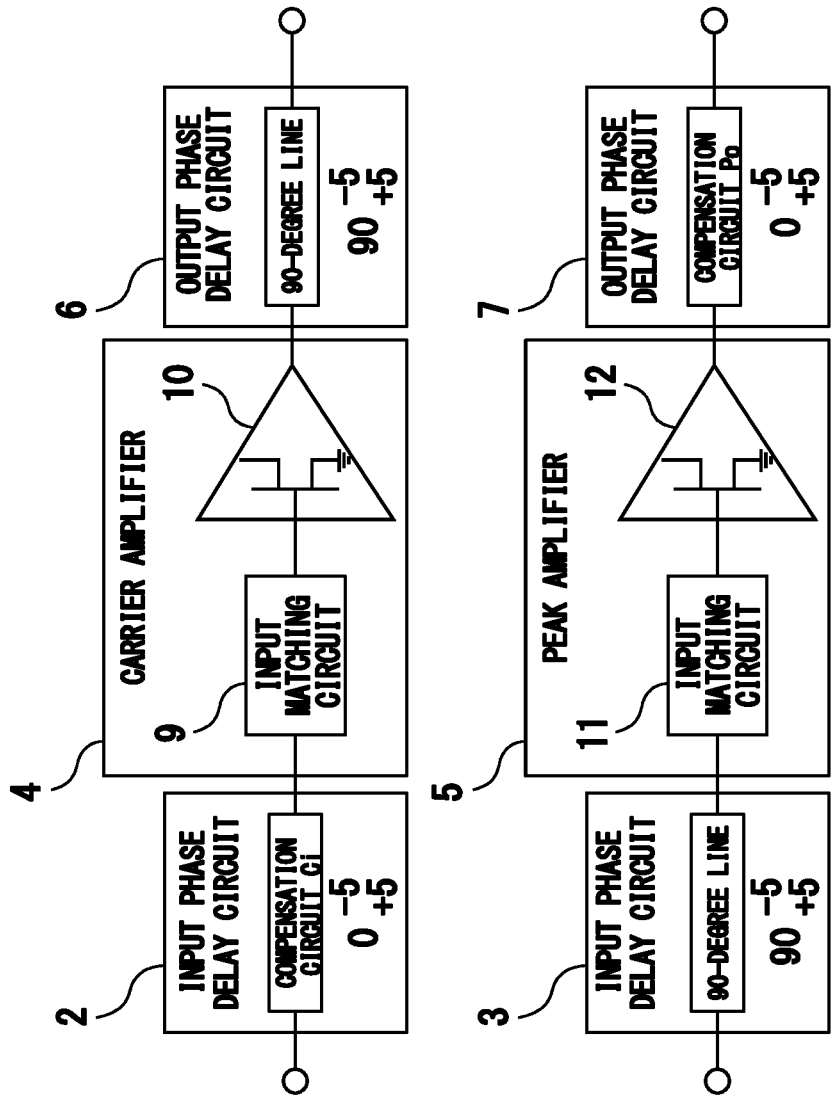
FIG. 10 is a circuit diagram illustrating a specific example of the Doherty amplifier according to Embodiment 1.
Figure 11:
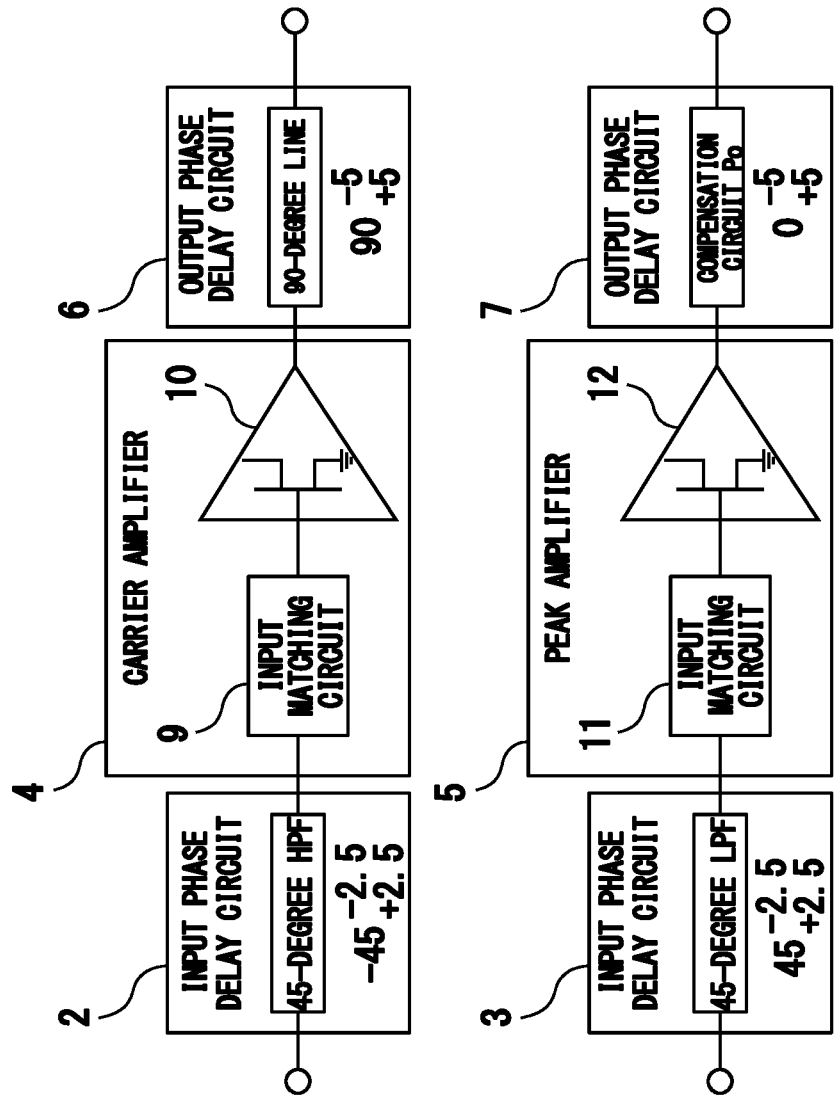
FIG. 11 is a circuit diagram illustrating a specific example of the Doherty amplifier according to Embodiment 1.

FIG. 10 and FIG. 11 are circuit diagrams illustrating specific examples of the Doherty amplifier according to Embodiment 1. Numbers at the bottom left within the first input phase delay circuit 2, the second input phase delay circuit 3, the first output phase delay circuit 6 and the second output phase delay circuit 7 in the drawings indicate pass phases at the center frequency fc. Numbers on upper right sides thereof indicate deviation of the pass phases from the center frequency fc at a lower limit frequency fl. Numbers on lower right sides indicate deviation of the pass phases from the center frequency fc at an upper limit frequency fh. Positive values of these numbers indicate phase lag, and negative values indicate phase lead. Here, a case will be considered where in-band deviation of a compensation circuit Po is ±5 degrees.

In FIG. 10, a compensation circuit Ci is inserted into the first input phase delay circuit 2. The compensation circuit Ci has a pass phase of 0 at the center frequency fc and has phase deviation at the lower limit frequency fl and the upper limit frequency fh of −5 degrees and +5 degrees, respectively. The compensation circuit Ci can be implemented with an LC circuit, or the like, which is connected in parallel and which resonates at fc. The deviation within the band can be easily adjusted by changing a ratio of L and C. Each of the second input phase delay circuit 3 and the first output phase delay circuit 6 are constituted by a 90-degree line. In a band from 3.3 to 3.7 GHz, a non-band is about 11%, and thus, deviation within the band becomes substantially 10 degrees. If the pass phase of the carrier amplifier 4 is the same as the pass phase of the peak amplifier 5, it is only necessary to take into account the phases of the input phase delay circuit and the output phase delay circuit. A delay by the first input phase delay circuit 2 and the first output phase delay circuit 6 on the carrier amplifier 4 side is 90±10 degrees. On the other hand, in a similar manner, a delay by the second input phase delay circuit 3 and the second output phase delay circuit 7 on the peak amplifier 5 side is 90±10 degrees. Thus, the carrier amplifier 4 and the peak amplifier 5 operate at the same phase, and thus, it can be considered that the carrier amplifier 4 and the peak amplifier 5 operate independently from each other. In this event, the first output phase delay circuit 6 of the carrier amplifier 4 does not include a compensation circuit, and thus, wide-band operation can be implemented. In a similar manner, wide-band operation can be implemented also on the peak amplifier 5 side.

In FIG. 11, a 45-degree high-pass filter (HPF) is used as the first input phase delay circuit 2. A 45-degree low-pass filter (LPF) is used as the second input phase delay circuit 3. The HPF can be constituted by, for example, a parallel inductor and a serial capacitor. The LPF can be constituted by, for example, a parallel capacitor and a serial inductor. Deviation within the band of phases of the LPF and the HPF become approximately half of the deviation of a 90-degree phase shifter. A delay by the first input phase delay circuit 2 and the first output phase delay circuit 6 on the carrier amplifier 4 side is 45±7.5 degrees. On the other hand, in a similar manner, a delay by the second input phase delay circuit 3 and the second output phase delay circuit 7 on the peak amplifier 5 side is 45±7.5 degrees. Thus, the carrier amplifier 4 and the peak amplifier 5 operate at the same phase, and thus, the cater amplifier 4 and the peak amplifier 5 can be considered independently from each other. In this event, the first output phase delay circuit 6 of the carrier amplifier 4 does not include a compensation circuit, and thus, wide-band operation can be implemented. In a similar manner, wide-band operation can be implemented also on the peak amplifier 5 side.

In a case where deviation of the LPF and the HPF at the second output phase delay circuit 7 is shifted from ±5 degrees, the phase deviation can be adjusted by adjusting the phases of the LPF and the HPF. For example, in a case where deviation at the second output phase delay circuit 7 is ±10 degrees, the LPF is deleted to make the delay of the LPF 0 degree, and the delay at the HPF is made ±90 degrees. As a result of this, the pass phase on the cater amplifier 4 side and the pass phase on the peak amplifier 5 side become 0±10 degrees, so that it is possible to implement in-phase operation. Further, various changes of pass characteristics at the second output phase delay circuit 7 can be supported by combination of the LPF, the HPF and a resonant circuit.

Figure 12:
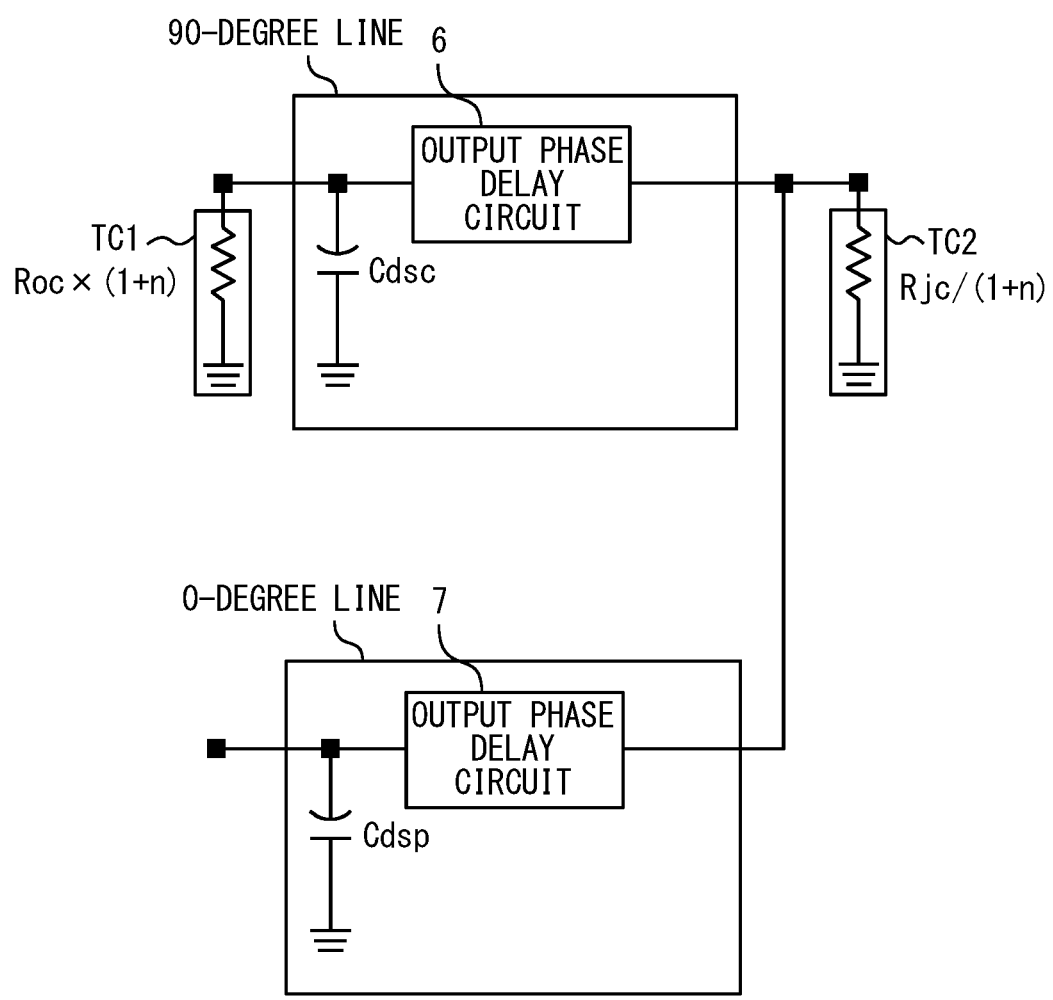
FIG. 12 is a view for explaining behavior of the carrier amplifier and the peak amplifier upon back-off.

FIG. 12 is a view for explaining behavior of the carrier amplifier and the peak amplifier upon back-off. The second transistor 12 of the peak amplifier 5 is in an off state, and thus, the terminal TP1 is an open end. Further, when viewed from the composite point 13, a value obtained by dividing, by frequency, susceptance of a 0-degree line constituted by the parasitic capacitance Cdsp of the second transistor 12 and the second output phase delay circuit 7 increases with the frequency. Thus, the state becomes a state in which the compensation circuit Cmp1 is added as illustrated in FIG. 3, so that wide-band characteristics as illustrated in FIG. 8 can be achieved.

Figure 13:
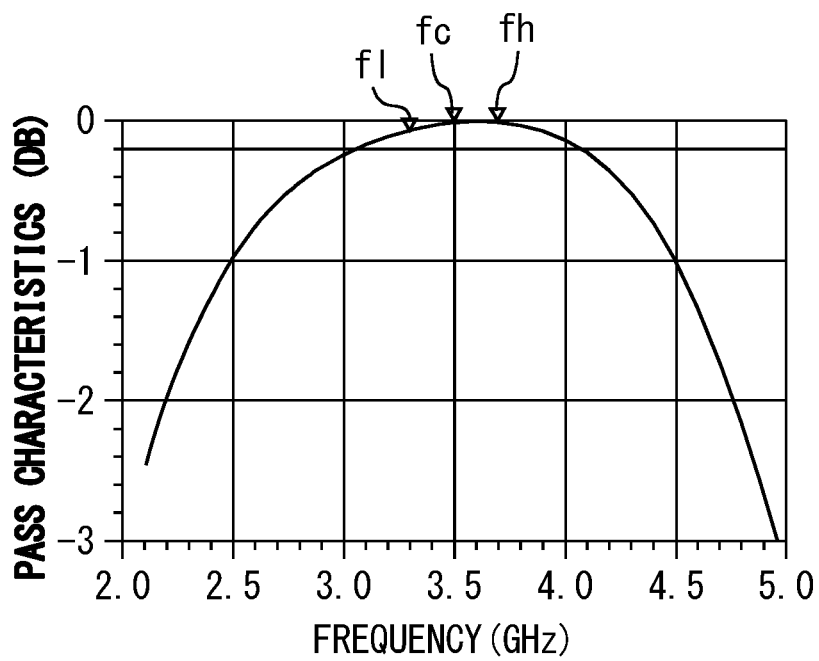
FIG. 13 is a view indicating band characteristics when the output circuit of the Doherty amplifier according to Embodiment 1 is in a saturation state.
Figure 14:
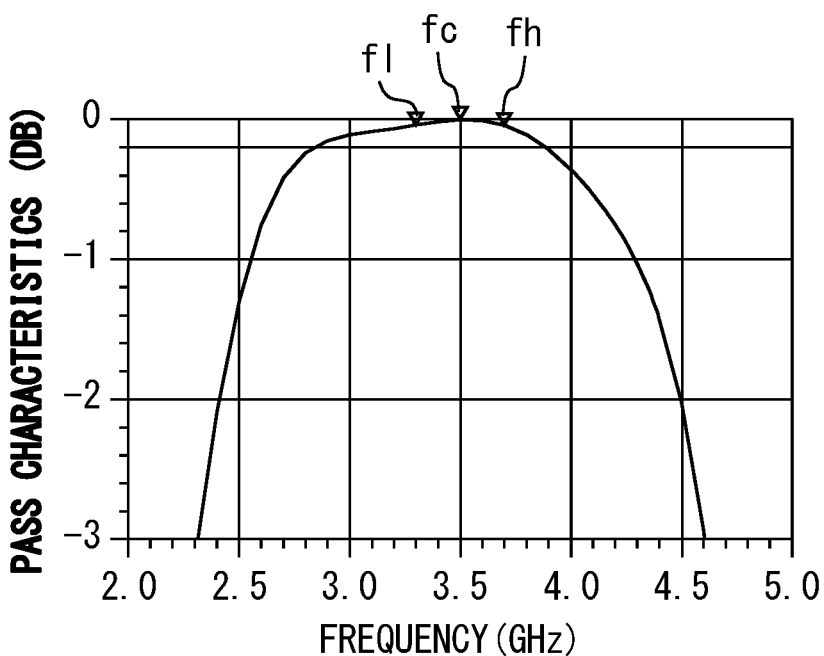
FIG. 14 is a view indicating band characteristics upon back-off operation of the output circuit of the Doherty amplifier according to Embodiment 1.

FIG. 13 is a view indicating band characteristics when the output circuit of the Doherty amplifier according to Embodiment 1 is in a saturation state. FIG. 14 is a view indicating band characteristics upon back-off operation of the output circuit of the Doherty amplifier according to Embodiment 1. When an indication of wide-band characteristics is set at a point at which pass characteristics degrade by 0.2 dB, it can be seen that a band of approximately 1 GHz can be obtained in both cases.

Figure 15:
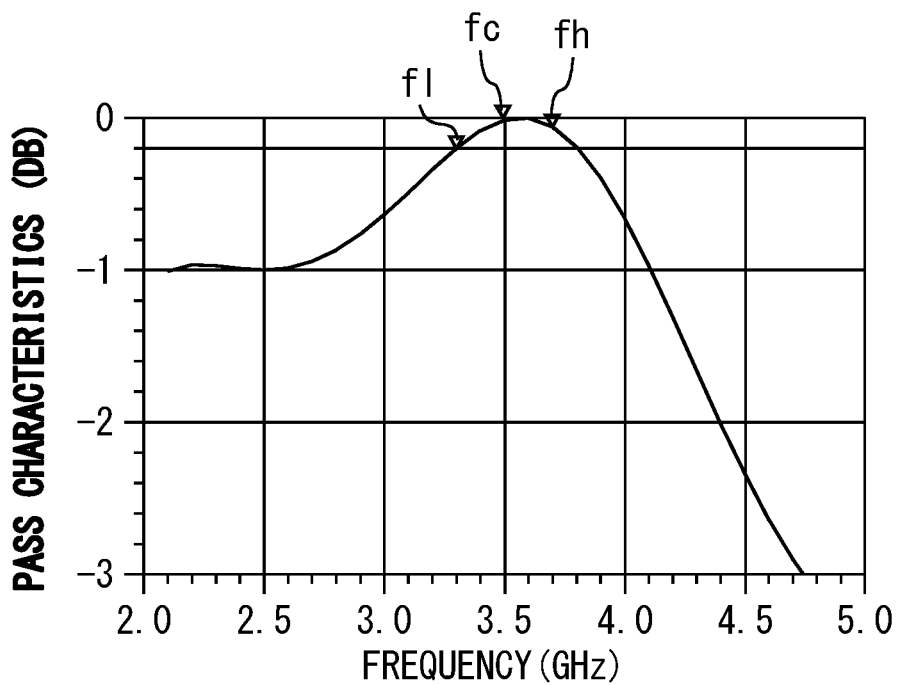
FIG. 15 is a view indicating band characteristics upon back-off of the Doherty amplifier in related art.

FIG. 15 is a view indicating band characteristics upon back-off of the Doherty amplifier in related art. A compensation circuit cannot be included, and thus, it can be seen that the band between points at which the pass characteristics degrade by 0.2 dB is 500 MHz and is narrow.

As described above, in the present embodiment, the parasitic capacitance on the drain side of the first transistor 10 of the carrier amplifier 4 and the first output phase delay circuit 6 constitute a 90-degree line, and the parasitic capacitance on the drain side of the second transistor 12 of the peak amplifier 5 and the second output phase delay circuit 7 constitute a 0-degree line. In this manner, the number of components is reduced by actively using the parasitic capacitance of the transistors. Further, a line with a long electrical length is not included, so that a circuit becomes smaller.

Further, a value obtained by dividing, by frequency, susceptance of the circuit constituted with the second transistor 12 and the second output phase delay circuit 7 when viewed from the composite point 13 when the peak amplifier 5 is off has a positive slope with respect to the frequency. By this means, it is possible to keep a phase difference between the carrier amplifier 4 side and the peak amplifier 5 side smaller over a wide band. It is therefore possible to achieve wide-band characteristics both upon saturation operation and upon back-off operation.

Embodiment 2

Figure 16:
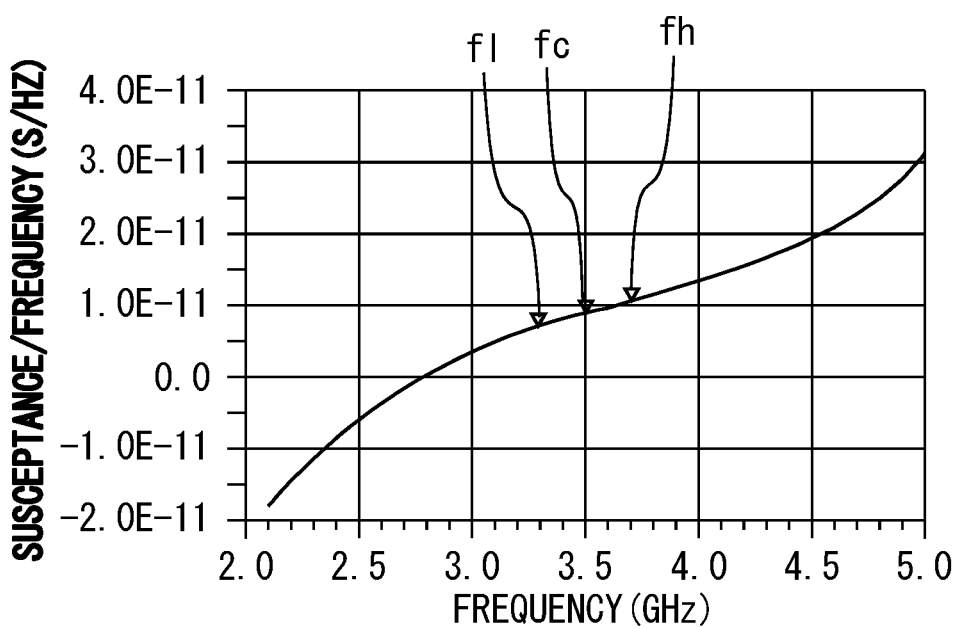
FIG. 16 is a view indicating frequency dependency of a value obtained by dividing, by frequency, susceptance of a second output phase delay circuit according to Embodiment 2.

FIG. 16 is a view indicating frequency dependency of a value obtained by dividing, by frequency, susceptance of a second output phase delay circuit according to Embodiment 2. In the present embodiment, a circuit configuration of the second output phase delay circuit 7 is set so that a value obtained by dividing, by frequency, susceptance X of the second output phase delay circuit 7 in the configuration in Embodiment 1 has a fixed value at the center frequency fc.

Figure 17:
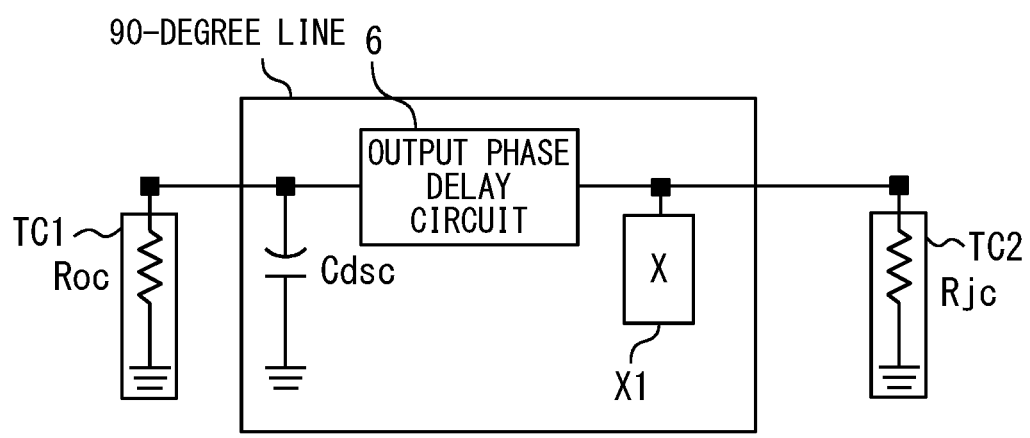
FIG. 17 is a view illustrating an equivalent circuit of an output circuit of Embodiment 2 upon saturation output.
Figure 17:
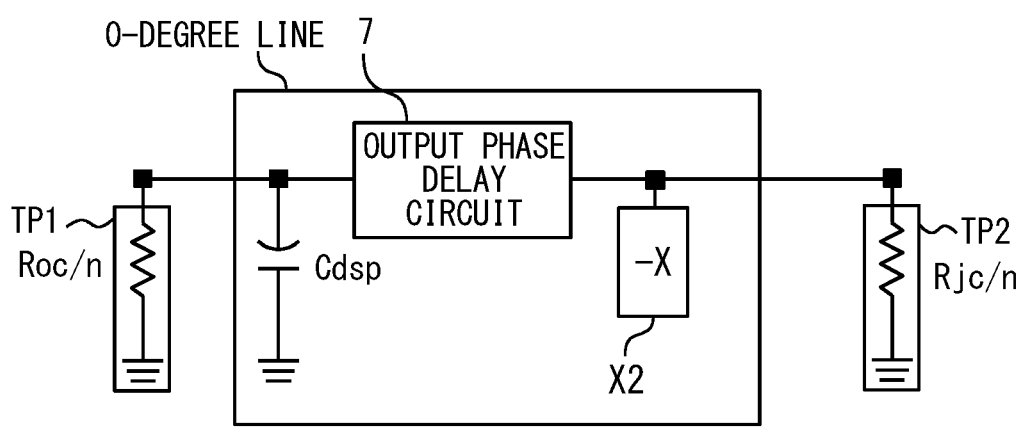

FIG. 17 is a view illustrating an equivalent circuit of an output circuit of Embodiment 2 upon saturation output. A circuit constant is adjusted so that the parasitic capacitance Cdsc of the transistor of the carrier amplifier 4, the first output phase delay circuit 6 and susceptance X1 of the first output phase delay circuit 6 become a 90-degree line at the center frequency. A circuit constant is adjusted so that the parasitic capacitance Cdsp of the transistor of the peak amplifier 5, the second output phase delay circuit 7 and susceptance X2 of the second output phase delay circuit 7 become a 0-degree line at the center frequency. Here, the susceptance X1 has the value X, the susceptance X2 has the value –X, and both leads to the composite point 11, so that they do not physically exist. The susceptance X1 on the carrier amplifier side is part of the peak amplifier side output delay circuit in terms of an equivalent circuit. Further, by making the carrier amplifier side and the peak amplifier side have the same phase from input to the composite point, both sides function as independent circuits as illustrated in FIG. 17.

Figure 18:
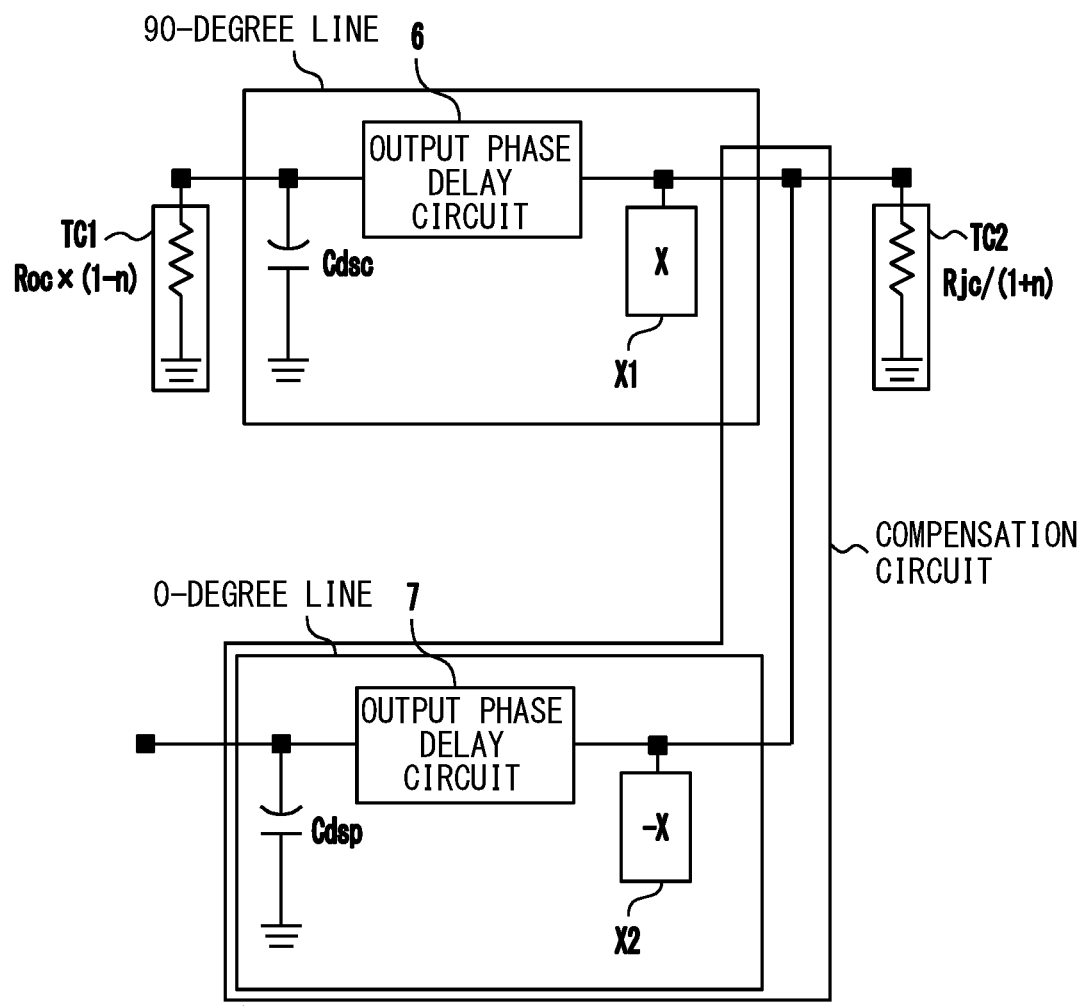
FIG. 18 is a view illustrating an equivalent circuit of the output circuit of Embodiment 2 upon back-off.

FIG. 18 is a view illustrating an equivalent circuit of the output circuit of Embodiment 2 upon back-off. The parasitic capacitance Cdsp of the second transistor 12 on the peak amplifier 5 side, the second output phase delay circuit 7 and the susceptance X2 function as a compensation circuit. Here, a value of the susceptance X1 is X, and a value of the susceptance X2 is –X, which has a relationship of canceling out each other. Note that the susceptance X1 and the susceptance X2 virtually exist and do not physically exist.

Functions of the present embodiment are similar to those in Embodiment 1, and wide-band characteristics can be achieved both upon saturation operation and upon back-off operation in a similar manner to Embodiment 1. Further, a circuit with a long electrical length is not included, and fixed susceptance is shared between the carrier amplifier 4 and the peak amplifier 5, and thus, the circuit becomes small. Still further, a circuit configuration becomes more flexible, and a slope of frequency characteristics of the value obtained by dividing the susceptance by the frequency can be adjusted.

Embodiment 3

Figure 19:
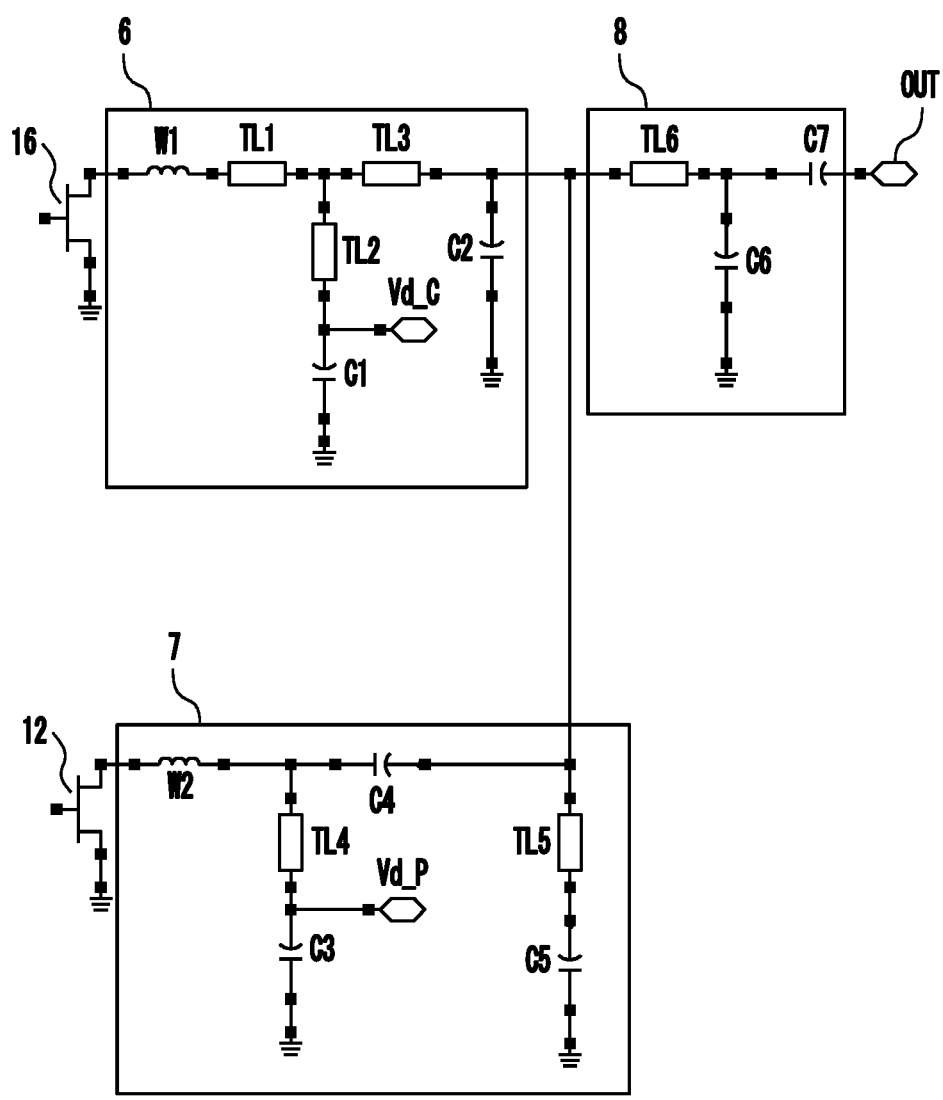
FIG. 19 is a view illustrating an output circuit of a Doherty amplifier according to Embodiment 3.

FIG. 19 is a view illustrating an output circuit of a Doherty amplifier according to Embodiment 3. The first output phase delay circuit 6 includes a wire W1, transmission lines TL1, TL2 and TL3, and capacitances C1 and C2. One end of the wire W1 is connected to a drain of the first transistor 10 of the carrier amplifier 4. One end of the transmission line TL1 is connected to the other end of the wire W1. One end of the transmission line TL2 is connected to the other end of the transmission line TL1. A pad Vd_C that applies a drain voltage to the first transistor 10 is connected at a connection point of the capacitance C1 and the transmission line TL2. The capacitance C1 for cutting a DC is connected between the other end of the transmission line TL2 and a ground point. One end of the transmission line TL3 is connected to a connection portion of the transmission line TL1 and the transmission line TL2, and the other end of the transmission line TL3 is connected to the composite point 13. The capacitance C2 is connected between the other end of the transmission line TL3 and the ground point. A length of the transmission line TL1 is longer than a length of the transmission line TL3. The circuit is set so that a pass phase from the drain of the first transistor 10 to the composite point 13 becomes 90 degrees at the center frequency fc.

The second output phase delay circuit 7 includes a wire W2, transmission lines TL4 and TL5, and capacitances C3, C4 and C5. One end of the wire W2 is connected to a drain of the second transistor 12. One end of the transmission line TL4 is connected to the other end of the wire W2. The capacitance C3 for cutting a DC is connected between the other end of the transmission line TL4 and the ground point. A pad Vd_p that applies a drain voltage to the second transistor 12 is connected to a connection point of the capacitance C3 and the transmission line TL4. One end of the capacitance C4 is connected to a connection point of the wire W2 and the transmission line TL4, and the other end of the capacitance C4 is connected to the composite point 13. One end of the transmission line TL5 is connected to the other end of the capacitance C4. The capacitance C5 for cutting a DC is connected between the other end of the transmission line TL5 and the ground point. The circuit is set so that a pass phase from the drain of the second transistor 12 to the composite point 13 becomes 0 degree at the center frequency fc.

The impedance conversion circuit 8 includes a transmission line TL6 and capacitances C6 and C7. One end of the transmission line TL6 is connected to the composite point 13. The capacitance C6 is connected between the other end of the transmission line TL6 and the ground point. The capacitance C7 is connected between the other end of the transmission line TL6 and the output terminal OUT.

Figure 20:
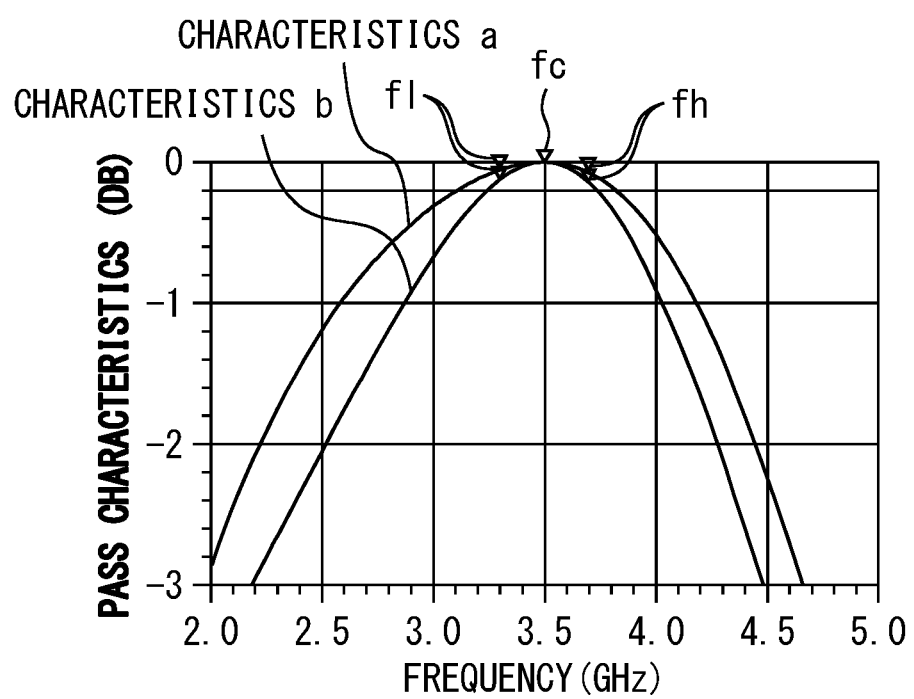
FIG. 20 is a view indicating pass characteristics of the first output phase delay circuit of the Doherty amplifier according to Embodiment 3.

The circuit configuration of the present embodiment functions in a similar manner to Embodiment 1, and thus, effects similar to the effects of Embodiment 1 can be obtained. Further, the length of the transmission line TL1 is set longer than the length of the transmission line TL3, and thus, the first output phase delay circuit 6 includes functions of a phase compensation circuit. FIG. 20 is a view indicating pass characteristics of the first output phase delay circuit of the Doherty amplifier according to Embodiment 3. In the drawing, a characteristic a is a characteristic in a case where the length of the transmission line L1 is longer than the length of the transmission line L3, and a characteristic b is a characteristic in a case where the length of the transmission line L1 is shorter than the length of the transmission line L3. It can be seen that if the length of the transmission line L1 is longer than the length of the transmission line L3, the band of the first output phase delay circuit 6 itself becomes wider.

Embodiment 4

Figure 21:
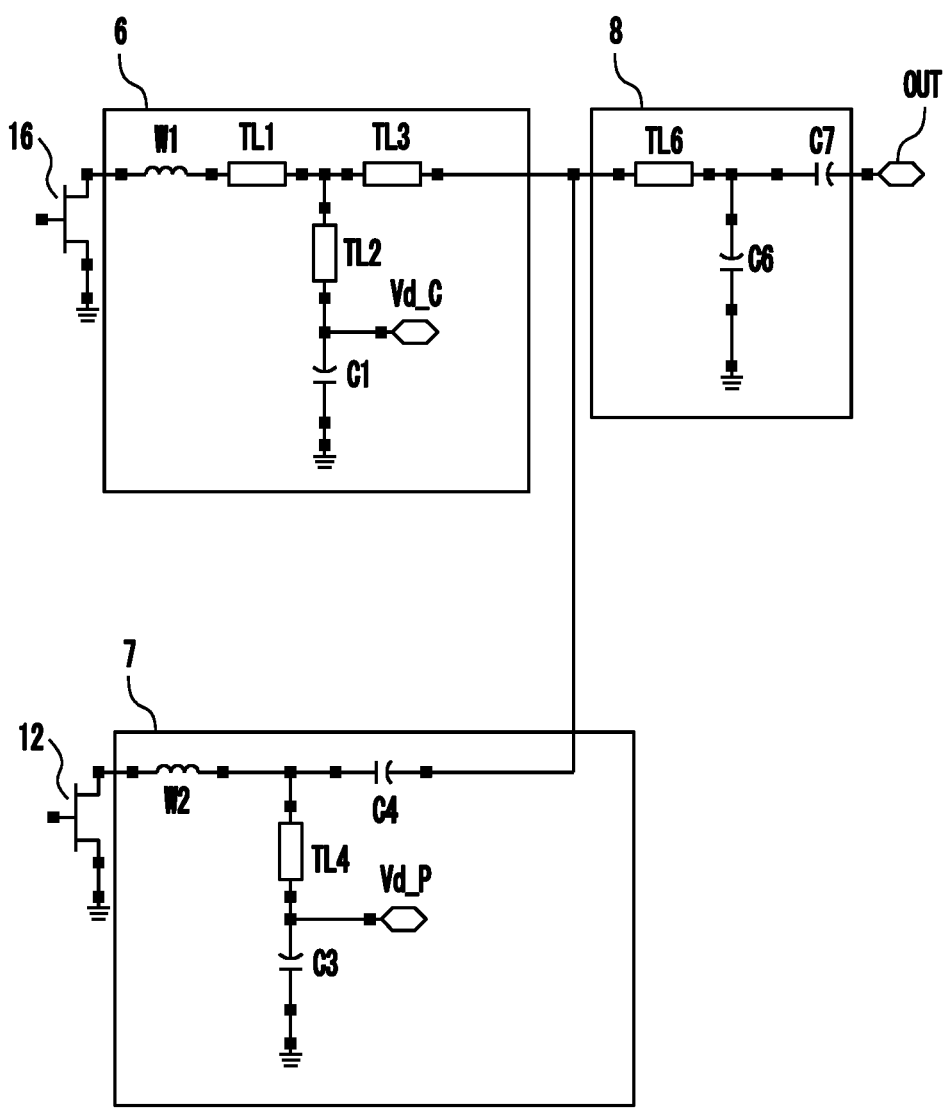
FIG. 21 is a circuit diagram illustrating output circuits of a carrier amplifier and a peak amplifier of a Doherty amplifier according to Embodiment 4.

FIG. 21 is a circuit diagram illustrating output circuits of a carrier amplifier and a peak amplifier of a Doherty amplifier according to Embodiment 4. The capacitance C2 is removed from the first output phase delay circuit 6 in Embodiment 3, and the transmission line TL5 and the capacitance C5 are removed from the second output phase delay circuit 7. Functions similar to those of Embodiment 3 can be exerted by adjusting a circuit constant. Compared to Embodiment 4, circuit elements are reduced, so that it is possible to achieve further downsizing.

Embodiment 5

Figure 22:
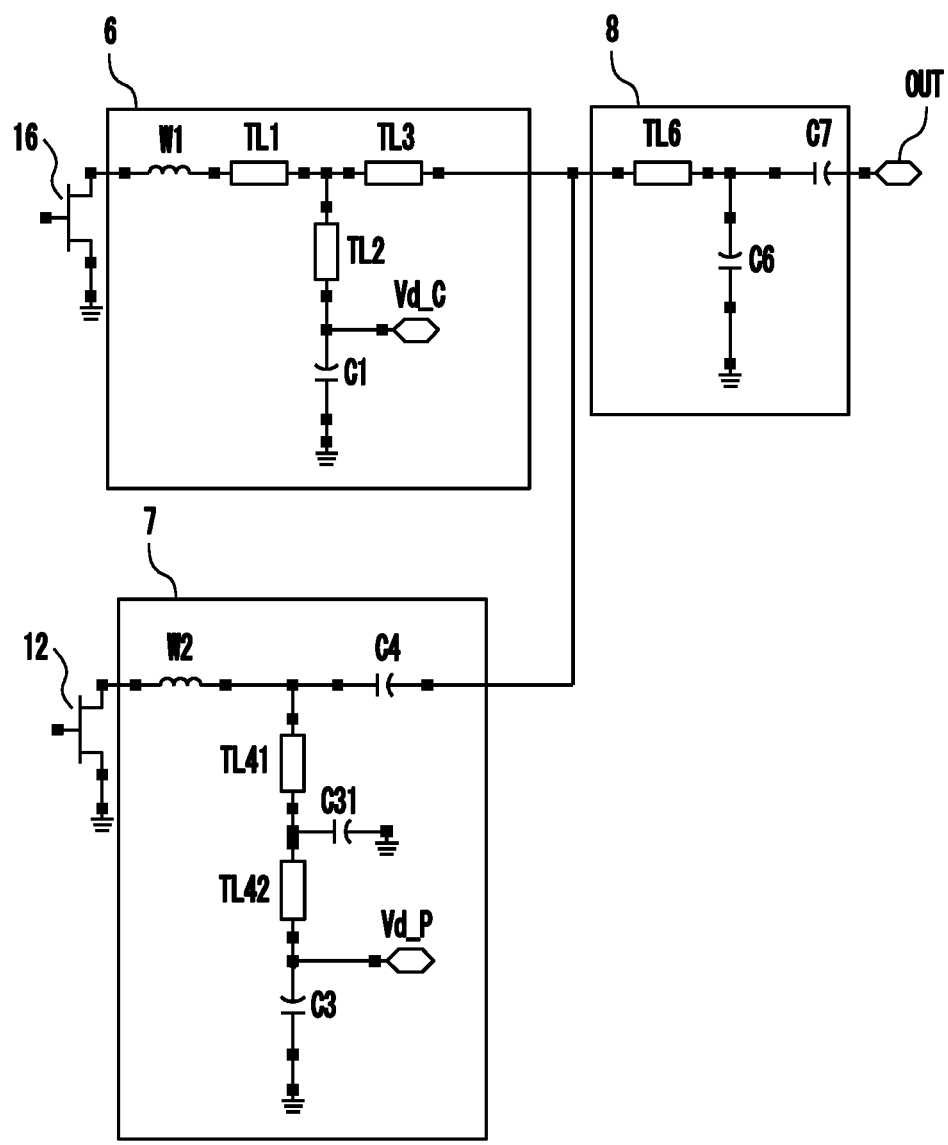
FIG. 22 is a circuit diagram illustrating output circuits of a carrier amplifier and a peak amplifier of a Doherty amplifier according to Embodiment 5.

FIG. 22 is a circuit diagram illustrating output circuits of a cater amplifier and a peak amplifier of a Doherty amplifier according to Embodiment 5. In the present embodiment, the transmission line TL4 in Embodiment 4 is replaced with two transmission lines TL41 and TL42 connected in series and a capacitance C31 connected between a connection point of the transmission lines TL41 and TL42 and the ground point.

Figure 23:
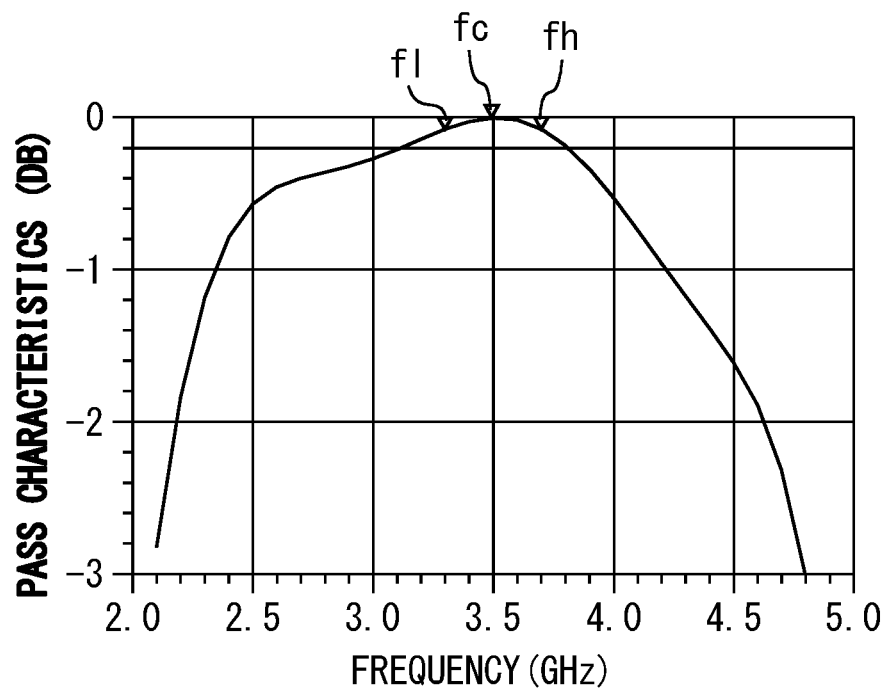
FIG. 23 is a view indicating pass characteristics of the Doherty amplifier according to Embodiment 4.
Figure 24:
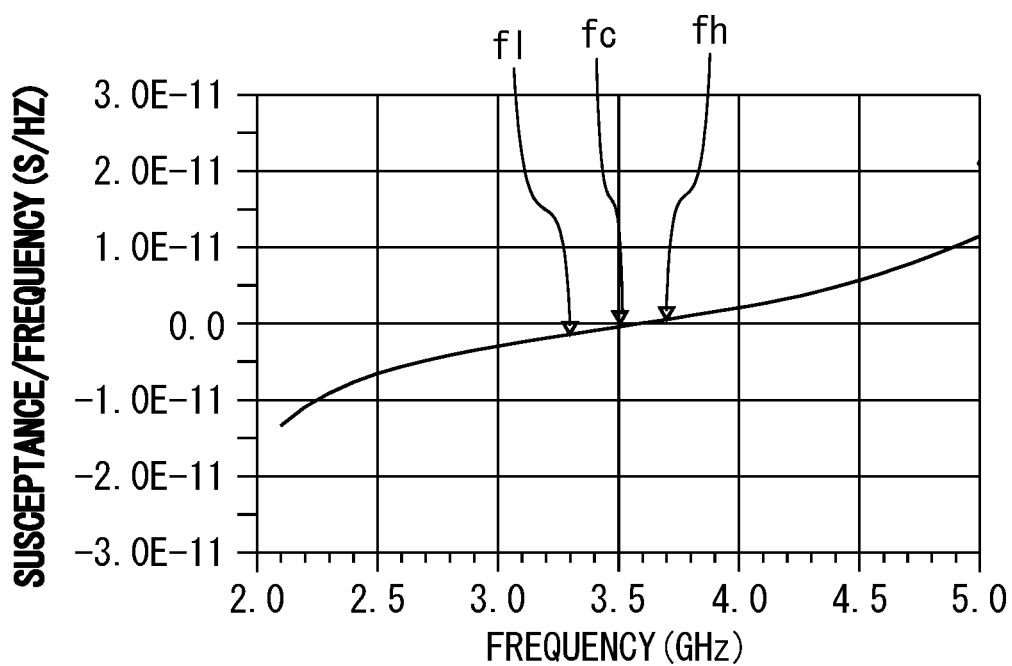
FIG. 24 is a view indicating frequency dependency of a value obtained by dividing, by frequency, susceptance of the Doherty amplifier according to Embodiment 4.

In Embodiment 4 described above, circuit elements are reduced, and thus, wide-band characteristics are slightly sacrificed. While wide-band characteristics can be maintained by making characteristic impedance of the transmission line TL4 smaller and making the transmission line TL4 longer, a circuit size increases. FIG. 23 is a view indicating pass characteristics of the Doherty amplifier according to Embodiment 4. FIG. 24 is a view indicating frequency dependency of a value obtained by dividing, by frequency, susceptance of the Doherty amplifier according to Embodiment 4. The band is wider than a circuit in related art, but narrower than Embodiment 1. This is because a slope of the value obtained by dividing, by the frequency, the susceptance of the output circuit of the peak amplifier 5 is not sufficient.

To address this, in the present embodiment, the transmission line TL4 in Embodiment 4 is replaced with the transmission lines TL41 and TL42 and the capacitance C31. This can increase the slope of the value obtained by dividing, by the frequency, the susceptance of the output circuit of the peak amplifier 5, so that it is possible to obtain wide-band characteristics equivalent to those in Embodiment 1. Note that a T-type transmission line including the transmission lines TL41 and TL42 and the capacitance C31 is set so that characteristics at the center frequency fc become the same as those of the transmission line TL4 in Embodiment 3.

Embodiment 6

Figure 25:
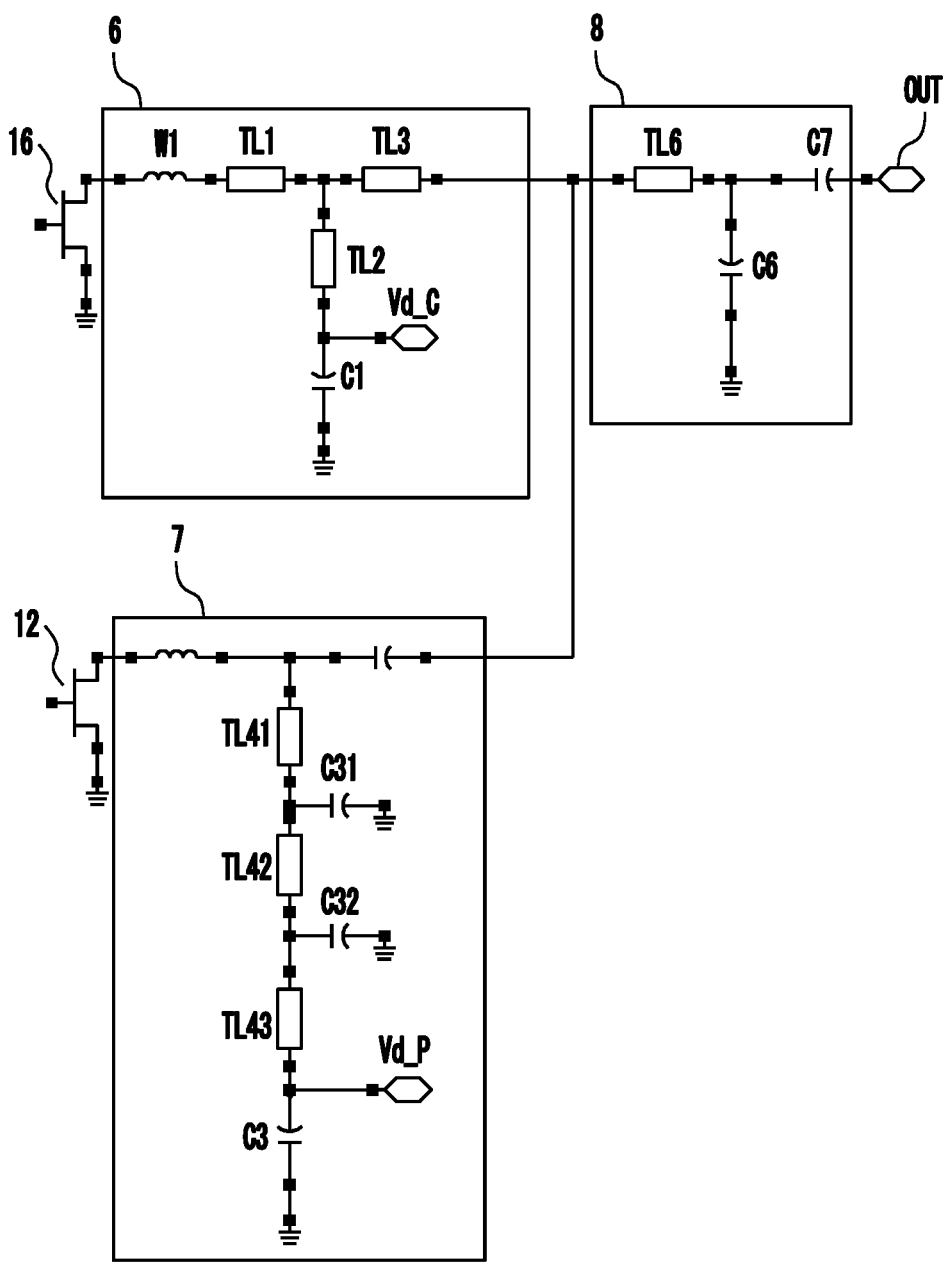
FIG. 25 is a circuit diagram illustrating output circuits of a carrier amplifier and a peak amplifier of a Doherty amplifier according to Embodiment 6.

FIG. 25 is a circuit diagram illustrating output circuits of a carrier amplifier and a peak amplifier of a Doherty amplifier according to Embodiment 6. In Embodiment 5, while wide-band characteristics comparable with the characteristics in Embodiment 3 can be obtained, a pass loss outside the band increases. To address this, in the present embodiment, the transmission line TL4 and the capacitance C31 in Embodiment 5 are replaced with a plurality of transmission lines TL41, TL42 and TL43 connected in series and a plurality of capacitances C31 and C32 respectively connected between connection points of adjacent transmission lines and the ground point. Unnecessary resonance does not occur in the vicinity of the band by using a plurality of capacitances in this manner, so that wider-band characteristics than the characteristics in Embodiment 5 can be achieved. Other configurations and effects are similar to those in Embodiment 1, and the like.

REFERENCE SIGNS LIST 1 divider; 2 first input phase delay circuit; 3 second input phase delay circuit; 4 carrier amplifier; 5 peak amplifier; 6 first output phase delay circuit; 7 second output phase delay circuit; 8 impedance conversion circuit; 10 first transistor; 12 second transistor; 13 composite point; C1,C2,C3,C4,C5, C31,C32 capacitance; TL1,TL2,TL3,TL4,TL5,TL41,TL42, TL43 transmission line; W1,W2 wire

The invention claimed is:

1. A Doherty amplifier comprising:
a divider dividing an input signal into first and second input signals;
a first input phase delay circuit delaying the first input signal;
a second input phase delay circuit delaying the second input signal;
a carrier amplifier including a first transistor amplifying an output signal of the first input phase delay circuit;
a peak amplifier including a second transistor amplifying an output signal of the second input phase delay circuit;
a first output phase delay circuit delaying an output signal of the carrier amplifier;
a second output phase delay circuit delaying an output signal of the peak amplifier; and
an impedance conversion circuit converting output impedance of a composite point of output of the first output phase delay circuit and output of the second output phase delay circuit,
wherein a pass phase of a path including the first input phase delay circuit, the carrier amplifier and the first output phase delay circuit is the same as a pass phase of a path including the second input phase delay circuit, the peak amplifier and the second output phase delay circuit in an operating band,
a parasitic capacitance on a drain side of the first transistor and the first output phase delay circuit constitute a 90-degree line at a center frequency in the operating band when viewed from the first transistor,
a parasitic capacitance on a drain side of the second transistor and the second output phase delay circuit constitute a 0-degree line at the center frequency when viewed from the second transistor, and
a value obtained by dividing, by frequency, susceptance of a circuit constituted with the second transistor and the second output phase delay circuit when viewed from the composite point when the peak amplifier is off has a positive slope with respect to the frequency.

2. The Doherty amplifier according to claim 1, wherein a value obtained by dividing, by frequency, susceptance of the second output phase delay circuit has a fixed value at the center frequency,
a pass phase in a circuit obtained by subtracting the susceptance from the second output phase delay circuit is 0 degree at the center frequency, and
a pass phase in a circuit obtained by adding the susceptance to the first output phase delay circuit is 90 degree at the center frequency.

3. The Doherty amplifier according to claim 1, wherein the first output phase delay circuit includes a first wire having one end connected to a drain of the first transistor, a first transmission line having one end connected to the other end of the first wire, a second transmission line having one end connected to the other end of the first transmission line, a first capacitance connected between the other end of the second transmission line and a ground point, and a third transmission line having one end connected to a connection portion of the first transmission line and the second transmission line and the other end connected to the composite point,
a pass phase from the drain of the first transistor to the composite point is 90 degree at the center frequency,
the second output phase delay circuit includes a second wire having one end connected to a drain of the second transistor, a fourth transmission line having one end connected to the other end of the second wire, a second capacitance connected between the other end of the fourth transmission line and the ground point, and a third capacitance having one end connected to a connection portion of the second wire and the fourth transmission line and the other end connected to the composite point, and
a pass phase from the drain of the second transistor to the composite point is 0 degree at the center frequency.

4. The Doherty amplifier according to claim 3, wherein a length of the first transmission line is longer than a length of the third transmission line.

5. The Doherty amplifier according to claim 3, wherein the first output phase delay circuit further includes a fourth capacitance connected between the other end of the third transmission line and the ground point, and
the second output phase delay circuit further includes a fifth transmission line having one end connected to the other end of the third capacitance, and a fifth capacitance connected between the other end of the fifth transmission line and the ground point.

6. The Doherty amplifier according to claim 3, wherein the fourth transmission line includes two transmission lines connected in series, and
the second output phase delay circuit further includes a sixth capacitance connected between a connection point of the two transmission lines and the ground point.

7. The Doherty amplifier according to claim 3, wherein the fourth transmission line includes a plurality of transmission lines connected in series, and
the second output phase delay circuit further includes a plurality of sixth capacitances respectively connected between connection points of adjacent transmission lines and the ground point.

* * * * *